United States Patent [19]
Chapman

[11] Patent Number: 5,930,294
[45] Date of Patent: Jul. 27, 1999

[54] FREQUENCY MEASUREMENT CIRCUIT

[75] Inventor: John T. Chapman, Cupertino, Calif.

[73] Assignee: Cisco Technology, Inc., San Jose, Calif.

[21] Appl. No.: 08/908,530

[22] Filed: Aug. 7, 1997

[51] Int. Cl.[6] ............................. G01R 23/02; H03D 3/00; H03K 9/06

[52] U.S. Cl. ........................... 375/213; 370/503; 327/48; 375/224

[58] Field of Search ..................................... 375/213, 357, 375/226, 224, 354, 359, 371, 373, 377; 370/401, 503, 507, 516, 465; 364/724.06; 379/14, 16, 22; 324/76.11, 76.62, 76.82; 702/7 J, 189; 327/47, 48, 49

[56] References Cited

U.S. PATENT DOCUMENTS

| | | | |
|---|---|---|---|
| 4,112,358 | 9/1978 | Ashida | 324/78 D |
| 4,215,308 | 7/1980 | Kusters | 324/78 D |
| 5,719,782 | 2/1998 | Mitsuoka | 702/75 |
| 5,748,570 | 5/1998 | Komoda | 368/202 |

*Primary Examiner*—Huy D. Vu
*Assistant Examiner*—Jean B Corrielus
*Attorney, Agent, or Firm*—Marger Johnson & McCollom

[57] ABSTRACT

A counter circuit and a frame control circuit receive a reference clock signal and one or more external clock signals. The counter circuit in combination with the frame control circuit measures the frequency of the external clock signal using either a high frequency measurement mode or a low frequency measurement mode. In the high frequency mode, the number of clocks in the external clock signal are counted for a known time period determined by a high frequency reference clock signal. In the low frequency mode, reference clocks are counted by the counter circuit for a second time period determined by the external clock signal frequency. The measurement circuit automatically switches between the high and low frequency measurement modes according to a minimum clock count value. If the number of external clocks counted during the frequency measurement mode is less than the minimum clock count value, the measurement circuit switches to the alternate frequency measurement mode.

21 Claims, 5 Drawing Sheets

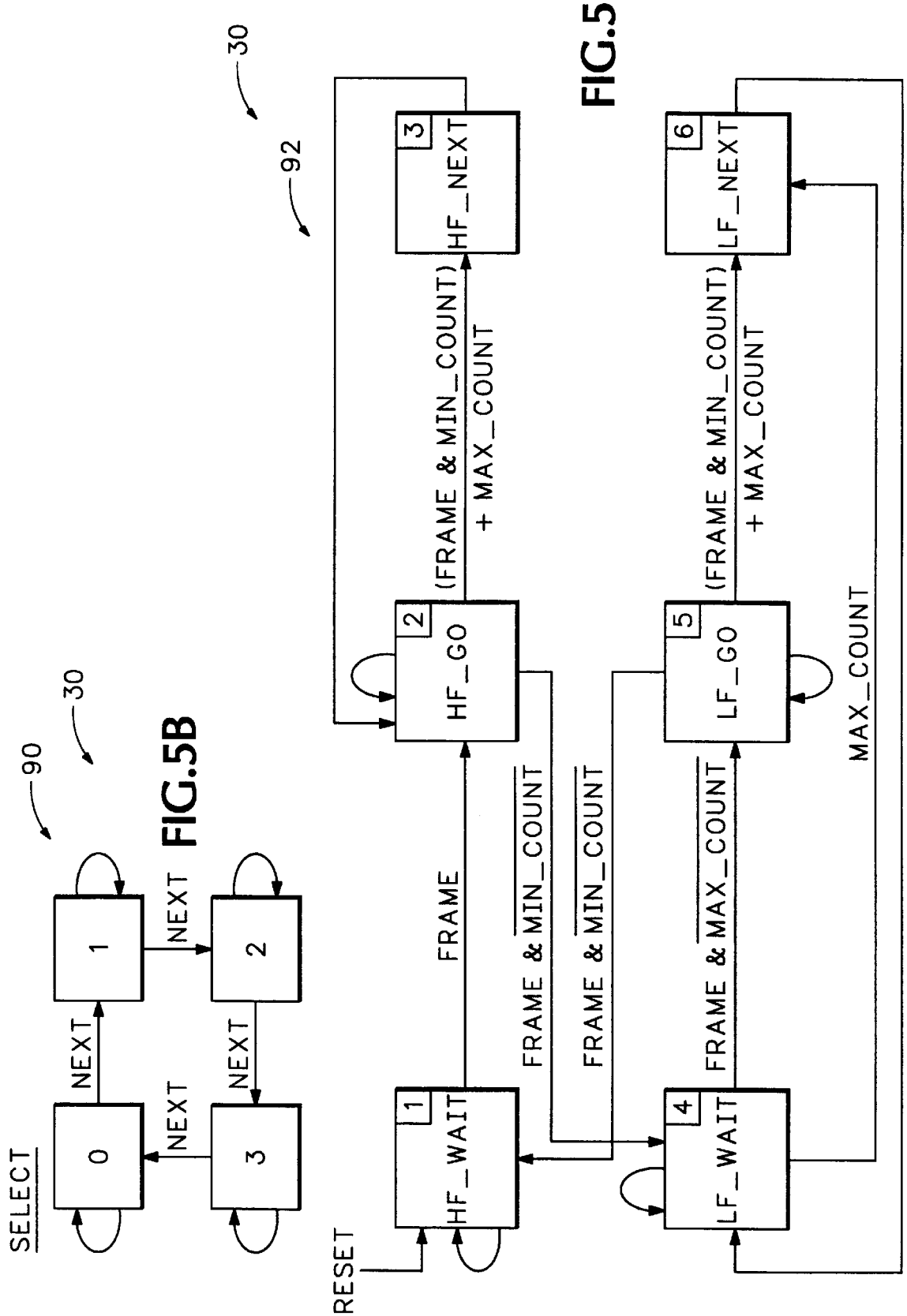

FREQUENCY MEASUREMENT CIRCUIT

BACKGROUND OF THE INVENTION

This invention relates generally to measuring clock frequency and more specifically to an auto ranging frequency measurement circuit that provides improved accuracy with a reduced number of logic gates.

Serial lines provide a point-to-point communication path between different pieces of digital equipment. Clock signals for the point-to-point connection are generated from one end of the serial line and then transmitted to the opposite end of the serial line. For example, data terminal equipment (DTE), such as a computer, is connected by a RS-232 or V.35 serial line to data communication equipment (DCE), such as a modem. Clock signals are generated by the modem and then transmitted over the RS-232 line to the computer. The computer must be initialized with the correct frequency of the clock line in order to correctly transfer data over the serial line.

In asynchronous serial lines, the clock and data signals are multiplexed together on a common channel. Equipment connected to opposite ends of the asynchronous serial line operate according to standardized line frequencies. Synchronous serial lines have separate clock and data lines and are often used with network routers to route data at higher baud rates than what is typically possible with asynchronous serial lines. In synchronous serial lines, the clock rate is set dynamically by the DCE. For example, the DCE might set the clock rate at 56 kiloHertz, 1.5 megaHertz, 2.0 megaHertz, 45 megaHertz or 52 megaHertz.

A device, such as a router, must be manually programmed with each clock frequency transmitted by each DCE. If the wrong clock frequencies are loaded into the router, data might not be routed efficiently over the different network lines. For example, the router might choose a line for routing data that has a slower line frequency than what is actually available on another line identified with the wrong frequency.

Frequency measurement circuits typically take multiple samples for one or two periods of a clock signal. The position of clock transitions, within the multiple samples, is used to determine the frequency of the clock signal. The sample frequency has to be relatively high compared to the measured clock frequency. Further, the sample frequencies must have a large dynamic range in order to effectively measure a wide range of frequencies. The circuitry used for generating high sampling frequencies is, therefore, complex and often requires sensitive discrete components.

In some serial lines, the clock signal is disabled when data is not currently being transferred. For example, some protocols do not transmit the clock signal during packet framing. This is referred to as clock gapping. Thus, the effective data transmission rate over the serial line does not correspond with the measured serial line frequency based upon an isolated measurement period.

Accordingly, a need remains for a simple frequency measurement circuit with improved accuracy and increased dynamic range.

SUMMARY OF THE INVENTION

A frequency measurement circuit includes a counter circuit and a frame control circuit each receiving a reference clock signal and one or more external clock signals. The counter circuit in combination with the frame control circuit measure the frequency of the external clock signal using either a high frequency measurement mode or a low frequency measurement mode.

The high frequency measurement mode is used by the measurement circuit when the external clock signal is above a fast frequency threshold value. In the high frequency mode, the number of clocks in the external clock signal are counted for a known time period alternatively referred to as a time frame. The duration of the time frame is determined according to a low frequency signal from the reference clock circuit. The frequency of the external clock signal is derived according to the number of external clocks that occur during the one reference clock time frame. The high frequency measurement mode is capable of accurately measuring a wide range of high frequencies.

A low frequency measurement mode is used by the measurement circuit when the external clock signal is below a second frequency threshold value greater than the frequency threshold value. In the low frequency mode, the number of reference clocks are counted by the counter circuit for a second time frame interval. The duration of the second time frame is determined by the external clock signal frequency. During the low frequency mode, a faster reference clock frequency is used to count the duration of the second time frame interval. The frequency of the external clock is derived according to the number of high frequency reference clocks that occur during one external clock time frame. Thus, the low frequency measurement mode is capable of measuring a wide range of low frequencies.

The measurement circuit automatically switches between the high and low frequency measurement modes according to a minimum clock count value. If the number of external clocks recorded during the high frequency mode is less than the minimum clock count value, the external clock signal is determined to be below the first frequency threshold value. The measurement circuit then automatically switches to the low frequency measurement mode, which uses the high frequency reference clock to measure the external clock time period (time frame).

There are overlapping operating frequency ranges between the high and low frequency modes. Measured frequencies below the first frequency threshold cause the frequency measurement circuit to change from the high frequency mode to the low frequency mode. The second frequency threshold value is above the first frequency threshold and causes the frequency measurement circuit to change from the low frequency mode to the high frequency mode. This hysteresis effect, where the frequency threshold value for switching from the high frequency measurement mode to the low frequency measurement mode is lower than the frequency threshold for switching from the low frequency measurement mode to the high frequency measurement mode, provides smoother and more reliable transitions between the two frequency measurement modes.

The dual-mode circuitry in the measurement circuit significantly increases the frequency measurement range. For example, the frequency measurement circuit can accurately measure clock rates from 300 Hertz up to 52 megaHertz. The minimum clock count used for switching between the high and low frequency modes, ensures accurate frequency measurements for any external clock signal within the frequency measurement range.

The measurement circuit provides real-time measurement of external clock frequencies at the DTE. A scanning circuit allows multiple clock lines from different channels to be measured with the same frequency measurement circuit. The frequency measurement circuit uses the measurement mode for the previously measured channel to reduce measurement times. The measured frequency values of the different clock signals are used to automatically configure a router with the clock frequencies of installed network lines. The router can, in turn, use the derived frequency information to more efficiently route data packets over network lines with the highest available baud rates.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 5A–5B are detailed state diagrams for a mode control circuit shown in FIG. 4.

DETAILED DESCRIPTION

Figure 1:
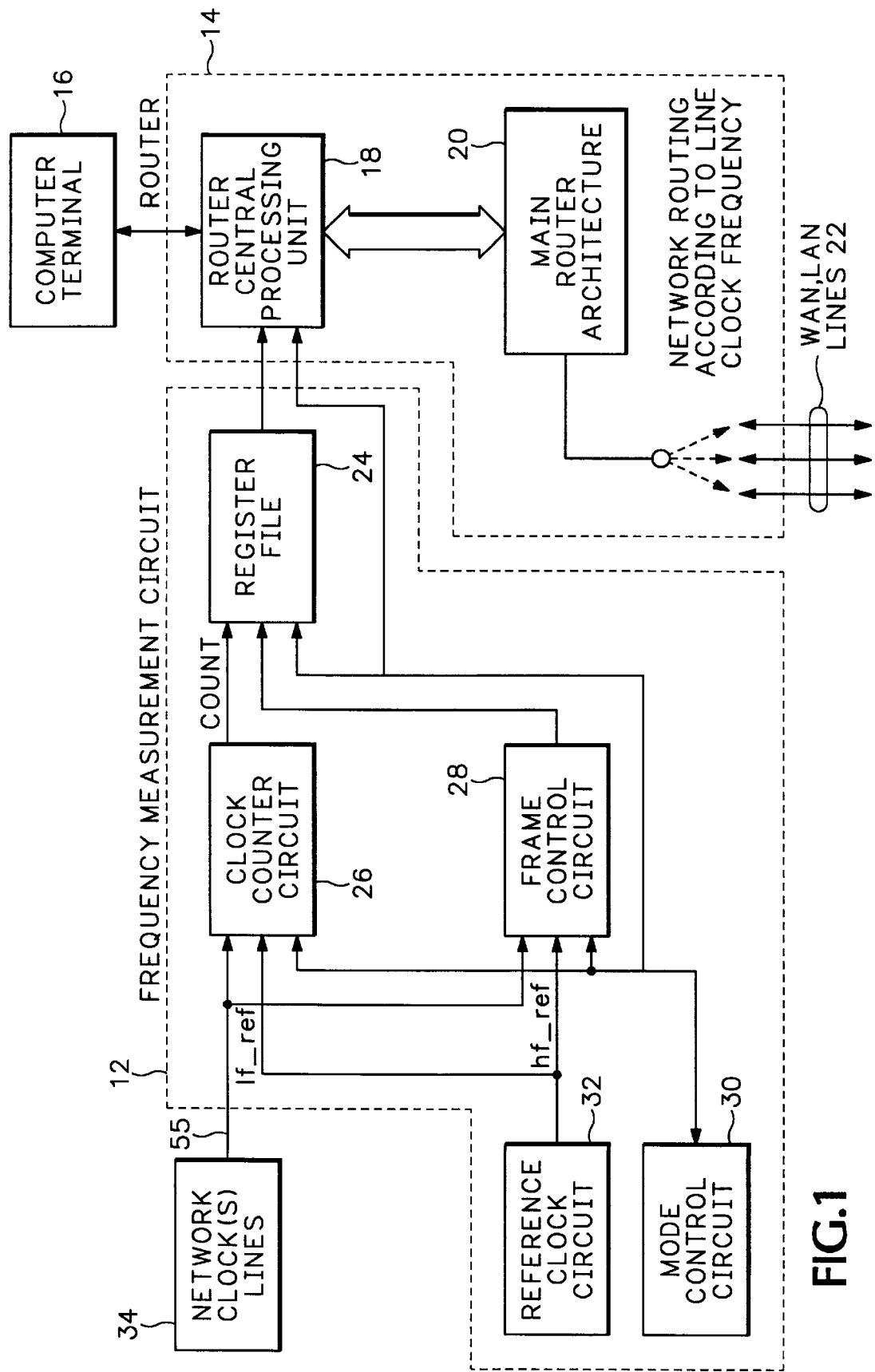
FIG. 1 is a block diagram showing a frequency measurement circuit according to the invention.

Referring to FIG. 1, a frequency measurement circuit 12 according to the invention is shown coupled between one or more external network clock lines 34 and a network router 14. The network clock lines 34 represent any clock signal that requires frequency measurement. In one embodiment of the invention, the frequency measurement circuit 12 is integrated with the router 14. The router 14 uses the frequency measurement information for routing data packets over various wide area network (WAN) and local area network (LAN) lines 22. For example, the frequency measurement circuit 12 may measure clock frequencies for several channels. If multiple channels are available, the data packets are routed on the channel with the highest measured clock frequency. Thus, the data packets are routed on the fastest available channel. Further, since the line frequencies are automatically measured, an operator does not have to manually configure the router for operating with each new line frequency.

Router 14 includes a central processing unit 18 and main router architecture 20. Router 14 is commercially available from Cisco Systems, 170 West Tasman Drive San Jose, Calif. 95134-1706. FIG. 1 shows one embodiment of the invention coupled to a router for measuring the frequency of external line clocks. However, the frequency measurement circuit 12 is adaptable and can be integrated with any system requiring frequency measurement of a signal.

The frequency measurement circuit 12 includes a reference clock circuit 32 that feeds a high frequency reference clock signal into a clock counter circuit 26 and feeds a low frequency reference clock signal into a frame control circuit 28. The counter circuit 26 and the frame control circuit 28 each selectively receive external clock signals from the network clock lines 34. A register file 24 receives a count value from the counter circuit 26. A mode control circuit 30 controls different components in the frequency measurement circuit 12 and specifically supplies a load signal to register file 24. The time frame signal generated in frame control circuit 28 is used in combination with the count value generated in counter circuit 26 by the central processing unit 18 for calculating the frequency of the external clock signal received from clock lines 55.

Figure 2:
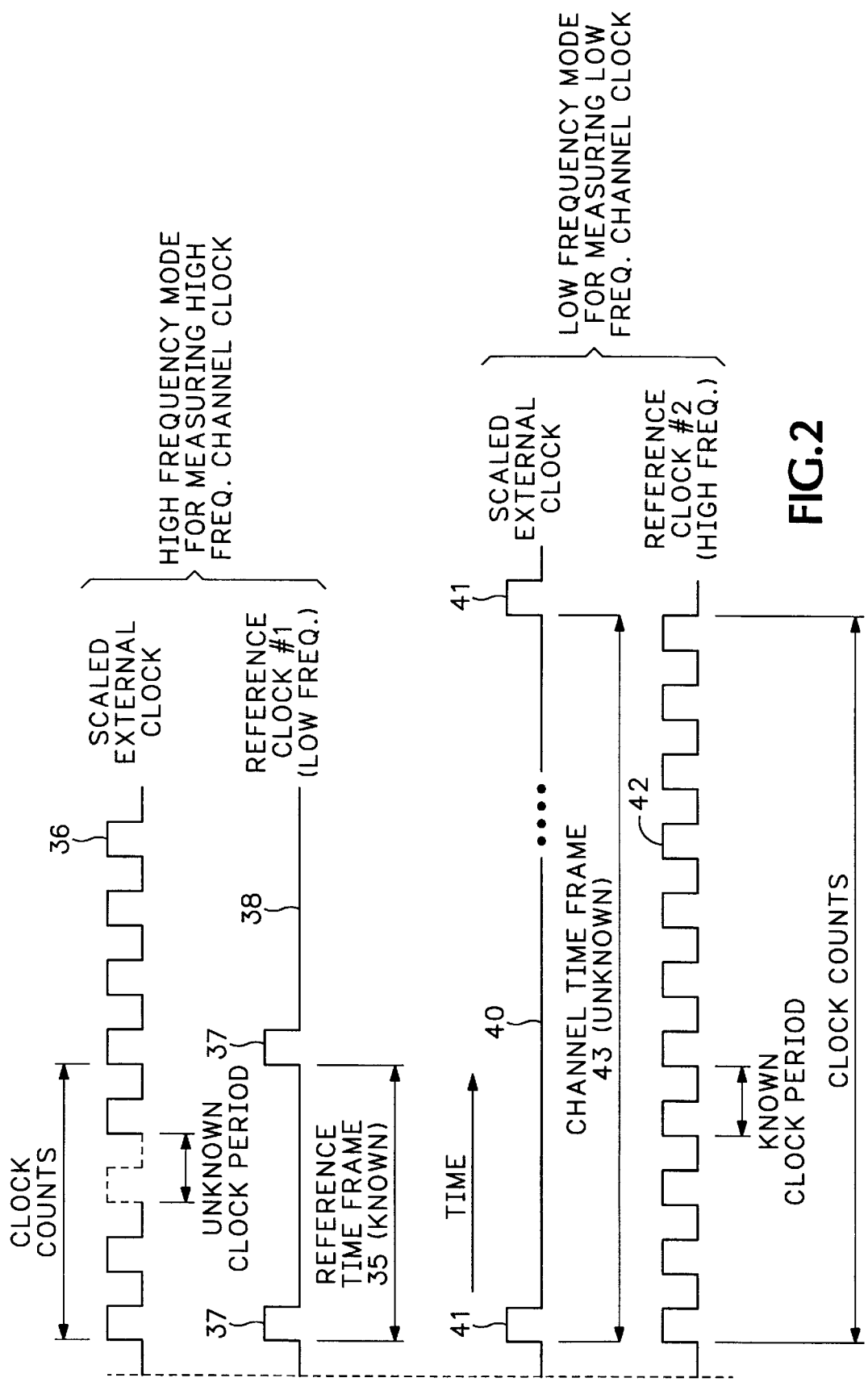
FIG. 2 is a timing diagram for the frequency measurement circuit shown in FIG. 1.

Referring to FIGS. 1 and 2, the frequency measurement circuit 12 operates generally in the following manner. The upper two timing signals in FIG. 2 show how the frequency of an external clock signal is measured in the high frequency mode. The term "external clock signal" is used hereinafter and is defined as any signal requiring frequency measurement and in the example shown in FIG. 3 also includes external clock signals that are initially scaled by a clock divider 56 (see FIG. 4). In the high frequency mode, the external clock signal 36 is above a first high frequency threshold value. The number of clocks or clock pulses in the scaled external clock signal 36 are counted by counter circuit 26 for a time frame 35. The time frame 35 is defined as the time period between two adjacent frame pulses 37. The time between frame pulses 37 are proportional to the clock period of a low frequency clock signal generated by reference clock circuit 32.

The frequency of the external clock signal 36 is unknown. The external clock 36 is scaled by 2^4=16 before it is measured by the frequency measurement circuit 12 (see FIG. 4). The frequency measurement circuit 12 averages the number of clocks counted over the known time frame 35 in order to determine the external clock frequency. For example, if the scaled external clock count is 188 for a time frame frequency of 85 Hz, the measured external clock frequency is 85 Hz×188×2^4=256 kHZ.

The lower two timing signals show how the frequency measurement circuit 12 measures the scaled external clock signal frequency in the low frequency mode. In the low frequency mode, the scaled external clock signal is below a second frequency threshold value. In the low frequency mode, clocks or clock pulses from a reference clock signal 42 are counted by counter circuit 26. The reference clock signal 42 is generated by reference clock circuit 32 but at a higher frequency than reference clock signal 38. The reference clock signal 42 is counted for a time frame 43 defined by the scaled external clock signal 40.

The time frame 43 of the scaled external clock signal 40 is defined as the time between two external clock pulses 41 and is initially unknown. The number of clocks or clock pulses from the reference clock signal 42 that occur during the time frame 43 are counted. The frequency of the reference clock 42 is known. Thus, the frequency of the scaled external clock signal 40 is determined by dividing the reference clock count by the reference clock frequency then multiplying by the scaling factor. For example, if the reference clock count in the low frequency mode is 1398 during one time frame 43 and the frequency of the scaled reference clock is 22,736 kHz, the measured external clock signal frequency is (22,368,000÷1398)×16=256 kHz.

Figure 3:
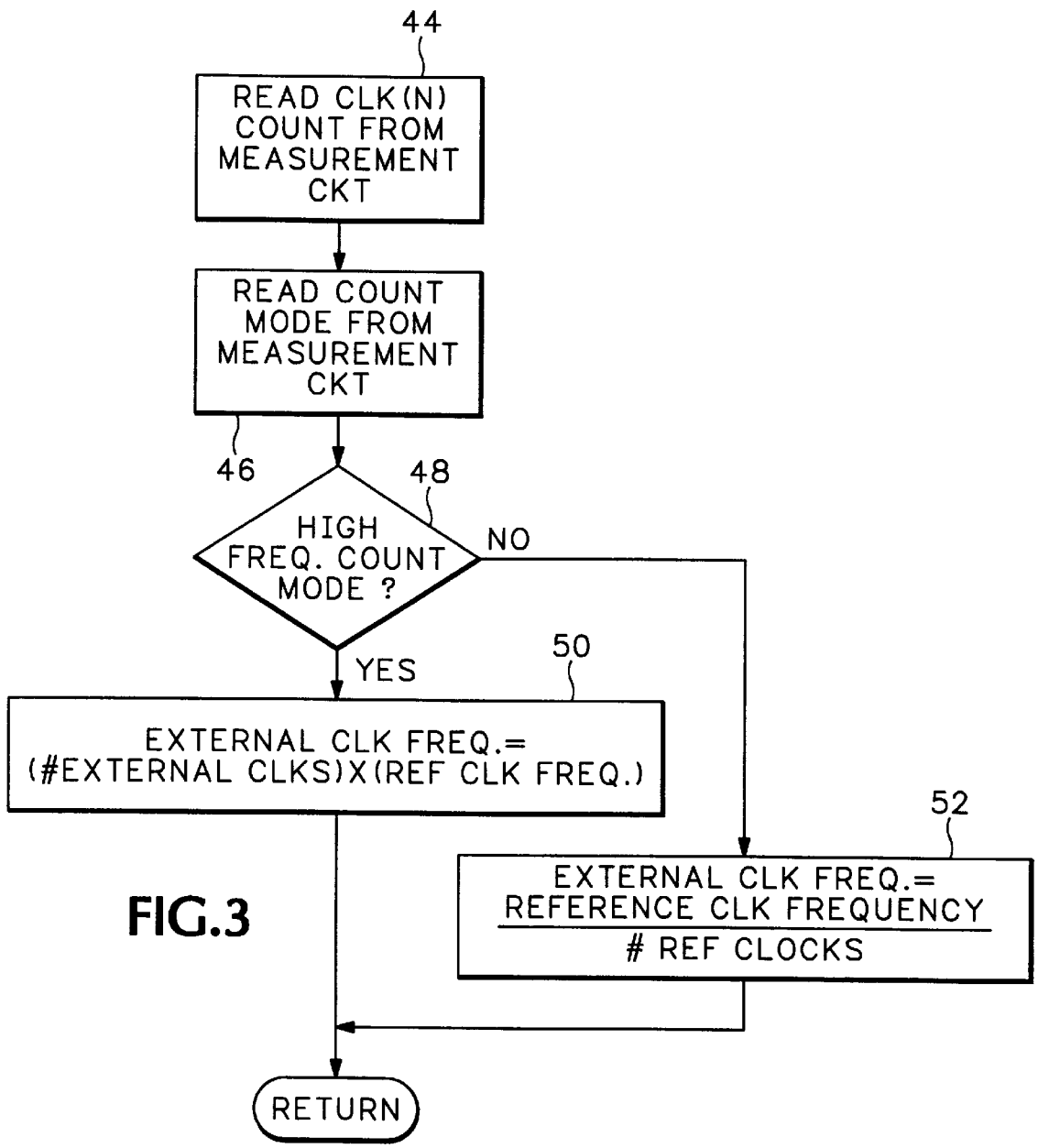
FIG. 3 is a step diagram showing how an external clock signal frequency is derived for the frequency measurement circuit in FIG. 1.

Referring to FIG. 3, the central processing unit (CPU), 18 shown in FIG. 1, reads the clock count from the register file 24 in step 44. If there is more than one clock signal to measure, the CPU 18 cycles through different sets of file registers each associated with one of the channels. A bit is stored in each channel register file 24 that identifies the frequency measurement mode used for deriving the count number. The CPU 18 reads the count mode bit in step 46.

If the high frequency measurement mode is detected in decision step 48, the CPU 18 uses the frequency calculation technique in step 50. Step 50 knows the clock count value represents the number of external clocks pulses 36 counted in one reference clock time frame 35 (FIG. 2). The external clock count is multiplied by the reference clock frequency to derive the scaled external clock frequency and multiplied by the scale factor to get the actual external clock frequency.

If the low frequency mode is detected in decision step 48, the CPU 18 uses the frequency calculation technique shown in step 52. The CPU 18 knows the clock count value represents the number of reference clocks 42 counted during one external clock time frame 43 (FIG. 2). Accordingly, the known reference clock frequency is divided by the number of reference clocks counted during the external clock time frame 43. The CPU 18 calculates the scaled external clock frequency and then returns to step 44 and reads the file register containing the clock count for the next channel.

Figure 4:
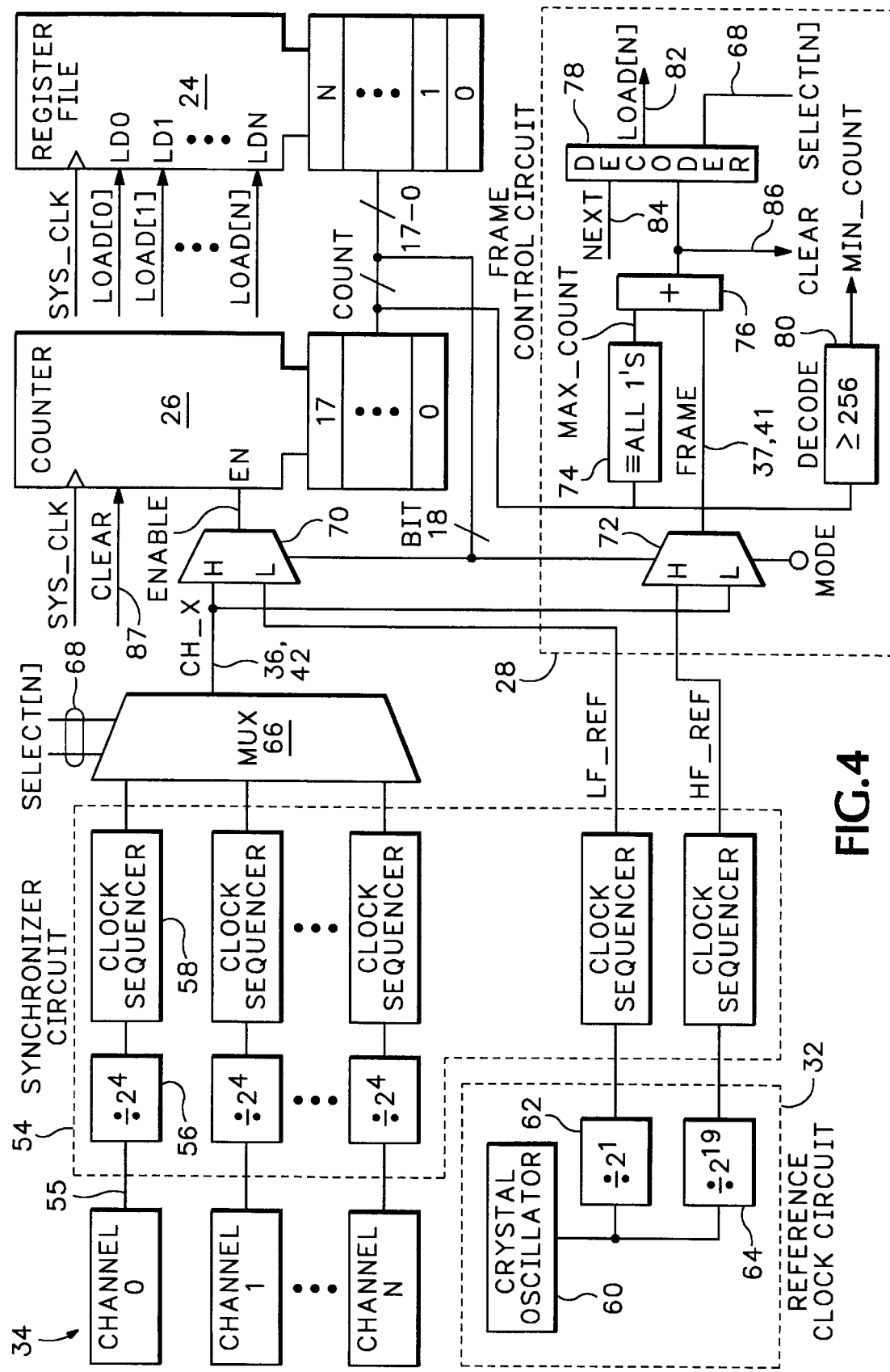
FIG. 4 is a detailed schematic diagram of the frequency measurement circuit shown in FIG. 1.

Referring to FIG. 4, one or more external clock lines 55 are coupled to the frequency measurement circuit 12 through different channels 34. A synchronizer circuit 54 is coupled to each external clock line 55 and the output from reference clock circuit 32. The synchronizer circuit includes clock dividers 56 that scale the frequency of the external clocks. A clock sequencer 58 synchronizes the scaled external clock domain and the reference clock domain with the system clock of the router 14. The clock sequencers 58 can use conventional sequencer circuitry known to those skilled in the art, or use a novel sequencer circuit described in co-pending U.S. patent application Ser. No. 08/908,278 filed Aug. 7, 1997 entitled SYSTEM FOR MANAGING SIGNALS IN DIFFERENT CLOCK DOMAINS AND A PROGRAMMABLE DIGITAL FILTER.

The reference clock circuit 32 includes a crystal oscillator 60 that is converted into a low frequency mode reference clock signal LF_REF by a frequency divider 62 and one of the clock sequencers 58. The LF_REF line is coupled through a multiplexer 70 to counter 26. A frequency divider 64 in combination with clock sequencer 58 converts the output of crystal oscillator 60 into a high frequency mode reference clock signal HF_REF. The HF_REF line is coupled to a multiplexer 72. The frequency of LF_REF line is magnitudes faster than the HF_REF line. For example, in FIG. 4, LF_REF is 2^18 times faster than HF_REF.

A multiplexer 66 selectively couples one of the scaled external clock signals CH_X to the multiplexer 70 and to the multiplexer 72. Select lines 68 are incremented by the mode control circuit 30 (see FIGS. 5A–5B) and continuously sequence through each of the external clock lines 55. Multiplexer 70 couples the CH_X line to the counter 26 during the high frequency mode and couples the LF_REF line to the counter 26 during the low frequency mode. Multiplexer 72 couples the HF_REF line to the frame control circuit 28 during the high frequency mode and couples the CH_X line to the frame control circuit 28 during the low frequency mode.

Count values from counter 26 are fed into register file 24. An OR gate 76 receives the output from an AND gate 74 and a frame pulse 34 or 41 from multiplexer 72. A "clear" line from OR gate 76 and a "next" line 84 and select lines 68 from mode control circuit 30 are coupled to a decoder 78. The decoder 78 drive "load" lines 82 that control when count values from counter 26 are loaded into different registers in register file 24. A decode circuit 80 compares the count value output from counter 26 with a preselected minimum count value. For example, the minimum count value shown in FIG. 4 is 256.

There is hysteresis between the high frequency mode and the low frequency mode. In one example, the hysteresis or overlap in the operating range for the high frequency mode and the low frequency mode is achieved by balancing the crystal oscillator prescale (e.g., 2^1 and 2^19) provided by the clock dividers 62 and 64, the channel prescale (e.g., 2^4) provided by clock dividers 56, the crystal oscillator frequency (e.g., 8.064 Million bits per second), and the resolution of the counter 26 (e.g., 18 bits). With the example numbers above, the low frequency mode will operate from 250 Hz to 250 KHz and the high frequency mode will operate from 64 KHz to 64 MHz, a ratio of 256,000:1. Changing any one of these 4 variables will reprogram the frequency threshold values for the upper and lower frequency measurement modes and the overall operating ranges for the frequency measurement circuit 12. Referring to FIG. 5A, a state machine 92 in the mode control circuit 30 (FIG. 1) controls the load lines 82 and a clear line 87 fed into the counter 26 (FIG. 4). The SELECT lines control which scaled external clock line 55 is measured via multiplexer 66 and control which register in register file 24 is loaded with the count number from counter 26. The NEXT line 84 is asserted when either the state machine 92 moves into the HF_NEXT or the LF_NEXT state. In response to the NEXT line, a state machine 90 increments the select lines 68, in turn, sequencing through each clock line 55. State machine 90 cycles through all clock lines 55 and then jumps back to the clock line 55 for first channel 0.

The high frequency mode is the default mode. After a reset signal is received, the mode control circuit 30 goes into a high frequency mode wait state HF_WAIT. When a frame pulse 37 is detected (FIG. 2), the state machine 92 moves into a high frequency go state HF_GO which clears counter 26 before counting external clock signal pulses 36.

When the next frame pulse 37 is detected, and the count value is above a minimum count value of 256 (MIN_COUNT=1), the state machine 92 moves to the high frequency next state HF_NEXT. If the count value reaches a maximum count value (MAX_COUNT=1) before the next frame pulse is detected, the mode control circuit also moves into the high frequency next state HF_NEXT. MAX_COUNT would occur if the external frequency under measurement was above and outside the frequency measurement circuit's measurement range. The counter 26 is set to all ones to represent the highest count. The HF_NEXT state activates the NEXT line initiating the register file 24 to load the count value from counter 26. The NEXT line also causes the state machine 90 to increment the select lines 68 and clear the counter 26. The state machine 92 then cycles back to the HF_GO state and begins counting clocks for the next clock line 55.

While in the HF_GO state, if the number counted by counter 26 is below the minimum count value 256, MIN_COUNT will equal zero. A MIN_COUNT of 256 represents a minimum accuracy of 0.39%. The state machine 92 switches from the high frequency measurement mode to the low frequency measurement mode by moving from the HF_GO state to the LF_WAIT state. In the low frequency measurement mode, the reference clock line LF_REF is operably coupled via multiplexer 70 to the counter 26 and the scaled external clock line CH_X is operably coupled to multiplexer 72 for generating frame pulses 41 (FIG. 2).

While the state machine 92 is in the LF_WAIT state, and waiting for the next frame pulse 41 from the scaled external line clock CH_X, the count from counter 26 may reach a MAX_COUNT value (e.g., all 1's). The selected channel is assumed to have a dead clock. The LF_WAIT state jumps to the LF_NEXT state which, in turn, increments the select lines 68 for receiving the scaled external clock signal from the next channel 34. The LF_NEXT state also loads the file register 24 with all ones. The CPU 24 is then notified by reading the register file that the clock is dead. The next state LF_NEXT then jumps back to the LF_WAIT state.

While in the LF_WAIT state, if a frame pulse 41 is detected and the clock count is not above the maximum threshold error value MAX_COUNT, the state machine jumps to the go state LF_GO. The counter 26 begins counting clocks from the reference clock line LF_REF. After detecting the next frame pulse, if the count value has not reached the minimum threshold value of 256 (MIN_COUNT=0), the state machine 92 switches back to the high frequency measurement mode by jumping to the HF_WAIT state.

A count less than 256 while in the low frequency measurement mode represents a high frequency clock signal. The high and low frequency measurement modes are designed to operate at an accuracy of greater than 0.39%. The accuracy threshold is programmable to vary the two thresholds used to switch between the two measurement modes. The upper and lower frequency measurement ranges are also programmable.

If the clock count is greater than the minimum clock threshold of 256, the circuit jumps to the LF_NEXT state. Changing to the LF_NEXT state loads the value from counter 26 into register file 24, clears the counter 26 and increments the select lines 68 to receive the clock signal from the next channel 34. The state machine 92 also changes from the LF_GO state to the LF_NEXT state if the count reaches the threshold error value MAX_COUNT.

The state machine defaults after a reset into the high frequency mode (HF_WAIT). The state machine 92 remains in the high frequency mode to measurement mode to measure the next line 55. If a low frequency mode condition is detected (MIN_COUNT=0), the state machine 92 automatically reconfigures the measurement circuit 12 for low frequency measurement mode operation. The measurement circuit 12 remains in the low frequency mode for subsequent channel measurements, until a high frequency measurement condition is detected (MIN_COUNT=0).

The following equations represent the output equations derived from logic states in state machine 92 that enable signals in the frequency measurement circuit 12. The notation "+" represents a logic OR relationship and the notation "*" represents a logic AND relationship.

MODE=LF_WAIT+LF_GO+LF_NEXT

LOAD[n]=SELECT[n]+NEXT

CLEAR=NEXT+[HF_WAIT+LF_WAIT]*FRAME

NEXT=HF_NEXT+LF_NEXT

As discussed above, the minimum count threshold is set at 256. The minimum count threshold is the basis for switching from the high frequency mode to the low frequency mode and also the basis for switching from the low frequency mode back to the high frequency mode. Thus, accuracy in both the high frequency mode and the low frequency mode is always at least $1/256=0.39\%$. The accuracy threshold can be increased by increasing the threshold value in decoder 80 or decreased by decreasing the threshold value (FIG. 4).

The frequency measurement circuit 12 provides substantial accuracy over a broad frequency range using a small number of gates. The circuit complexity of other frequency measuring equipment requires multiple circuit boards. The low gate count of the present invention allows integration on the same board or chip requiring frequency measurements.

The channel sequencing multiplexer 66 also allows the same frequency measurement circuit 12 to be used for multiple clock lines 55. The dual mode auto ranging capability allows the same circuitry to measure a wider range of signal frequencies.

In some serial lines, the clock signal is not generated during certain periods (e.g., packet framing). Thus, the actual data transmission rate over the serial line is not the same as the measured serial line clock frequency. The frequency measurement circuit 12 calculates the clock frequency over multiple external clock periods during each reference clock time frame. Since multiple external clocks are averaged during the time frame, non-clock conditions would also be detected. Thus, the measurement circuit 12 determines the actual effective transmission bit rate frequency which more accurately represents the bandwidth of the serial line.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A frequency measurement circuit, comprising:
    a reference clock circuit generating a reference clock signal;
    a counter circuit coupled to the reference clock circuit and receiving an external clock signal, the counter circuit generating a clock count value according to the reference clock signal or the external clock signal; and
    a frame control circuit receiving the reference clock signal and the external clock signal, the frame control circuit generating a time frame signal according to one of the reference clock signal and the external clock signal, the time frame signal used in combination with the clock count value for measuring a frequency of the external clock signal.

2. A frequency measurement circuit according to claim 1 including switching circuitry that switches the counter circuit and the frame control circuit between a first measurement mode and a second measurement mode according to the external clock signal frequency.

3. A frequency measurement circuit according to claim 2 wherein the switching circuitry in the first measurement mode operably couples the external clock signal to the counter circuit and operably couples the reference clock to the frame control circuit, the switching circuitry in the second measurement mode operably coupling the reference clock to the counter circuit and operably coupling the external clock signal to the frame control circuit.

4. A frequency measurement circuit according to claim 1 wherein the reference clock circuit comprises the following:
    an oscillator circuit;
    a first frequency divider generating a high frequency reference clock signal to the counter circuit; and
    a second frequency divider generating a low frequency reference clock signal to the frame control circuit.

5. A frequency measurement circuit according to claim 1 wherein the counter circuit includes the following:
    a binary counter receiving the reference clock signal and the external clock signal; and
    a register file coupled to both the binary counter and the frame control circuit, the register file loading the clock count value according to the time frame signal.

6. A frequency measurement circuit according to claim 5 including a mode control line coupled between the frame control circuit and the register file for loading a measurement mode bit with the clock count value.

7. A frequency measurement circuit according to claim 2 including a decoder coupled to the counter circuit for comparing the clock count value to a minimum count threshold number, the clock measurement circuit changing between the first measurement mode and the second measurement mode according to the compared clock count value and the minimum count threshold number.

8. A frequency measurement circuit according to claim 1 including an external line multiplexer coupled to multiple channels each having an associated external clock line, the multiplexer selectively coupling each one of the associated external clock lines to either the clock measurement circuit or the frame control circuit according to the frequency associated with the external clock lines.

9. A frequency measurement circuit according to claim 8 including a mode control circuit coupled to the counter circuit and the frame control circuit, the mode control circuit automatically controlling the external line multiplexer and configuring the counter circuit and frame control circuit according to the frequency of each external clock line.

10. A frequency measurement circuit according to claim 1 including a central processing unit coupled to the counter circuit for calculating the frequency of the external clock signal according to the clock count value and the time frame signal.

11. A frequency measurement circuit according to claim 10 including router circuitry coupled to the central processing unit, the router circuitry routing packets on different data lines according to the external clock signal frequency.

12. A network router, comprising:

a central processing unit;

routing circuitry coupled to the central processing unit for routing data packets between different network lines, at least a first one of the network lines including a clock line generating an input clock signal; and a frequency measurement circuit coupled to the central processing unit for measuring a frequency value of the input clock signal, the central processing unit automatically initializing the routing circuitry for routing data on the first network line according to the measured frequency value.

13. A network router according to claim 12 wherein the frequency measurement circuit comprises the following:

a reference clock circuit generating a reference clock signal;

a counter circuit coupled to the reference clock circuit and receiving the input clock signal, the counter circuit generating a clock count value according to one of the reference clock signal and the input clock signal; and a frame control circuit coupled to the reference clock circuit and receiving the input clock signal, the frame control circuit generating a time frame signal according to one of the reference clock signal and external clock signal, the time frame signal used in combination with the clock count value for measuring the frequency value of the input clock.

14. A network router according to claim 13 including switching circuitry that switches the counter circuit and the frame control circuit between a first measurement mode and a second measurement mode according to the external clock signal frequency.

15. A network router according to claim 14 wherein the switching circuitry in the first measurement mode operably couples the input clock signal to the counter circuit and operably couples the reference clock signal to the frame control circuit, the switching circuitry in the second measurement mode operably coupling the reference clock signal to the counter circuit and operably coupling the input clock signal to the frame control circuit.

16. A network router according to claim 15 including a multiplexer coupled to multiple clock lines associated with the multiple network lines and sequentially coupling each one of the clock lines to the frequency measurement circuit.

17. A method for measuring a frequency of a clock signal, comprising:

generating a reference timing signal having a reference frequency;

operating a circuit in a first frequency measurement mode when the clock signal is within a first frequency range, the first frequency measurement mode using the reference timing signal as a time frame for counting a number of clock signal clock cycles;

operating the circuit in a second frequency measurement mode when the clock signal is within a second frequency range, the second frequency measurement mode using the clock signal as the time frame for counting a number of reference timing signal clock cycles; and deriving the frequency of the clock signal in the first frequency measurement mode according to the number of counted clock cycles during the reference frequency time frame and deriving the frequency of the clock signal in the second frequency measurement mode according to the number of counted reference timing signal clock cycles during the clock signal time frame.

18. A method according to claim 17 including automatically changing between the first frequency measurement mode and the second frequency measurement mode according to the number of counted clock cycles.

19. A method according to claim 17 including generating a first reference timing signal frequency for the first frequency measurement mode and a second reference timing signal frequency for the second measurement mode.

20. A method according to claim 17 including the following steps:

providing multiple clock signals;

selecting the first frequency measurement mode for measuring a first one of the multiple clock signals;

switching to the second frequency measurement mode when the number of counted clock cycles for the first clock signal is less than a preselected value;

initially measuring subsequent ones of the multiple clock signals using the same frequency measurement mode used for measuring a previous one of the multiple clock signals.

21. A method according to claim 17 wherein the first frequency range with the second frequency range overlap providing hysteresis between the first frequency measurement mode and the second frequency measurement mode.

* * * * *